United States Patent [19]
Shan et al.

[11] Patent Number: 5,891,350
[45] Date of Patent: Apr. 6, 1999

[54] ADJUSTING DC BIAS VOLTAGE IN PLASMA CHAMBERS

[75] Inventors: Hong Ching Shan, San Jose; Evans Yip Lee, Milpitas; Michael D Welch, Livermore; Robert W Wu, Pleasanton; Bryan Pu, San Jose; Paul Ernest Luscher; James David Carducci, both of Sunnyvale; Richard Blume, San Jose, all of Calif.

[73] Assignee: Applied Materials, Inc., Santa Clara, Calif.

[21] Appl. No.: 666,981

[22] Filed: Jun. 20, 1996

Related U.S. Application Data

[63] Continuation-in-part of Ser. No. 356,825, Dec. 15, 1994, Pat. No. 5,605,637.

[51] Int. Cl.$^6$ .................................................. H05H 1/00
[52] U.S. Cl. ........................ 216/71; 118/723 E; 156/345
[58] Field of Search ........................ 118/723 E, 723 MP, 118/723 MW, 723 ME, 723 MR, 723 MA, 723 I, 723 IR; 156/345; 204/298.01, 298.02, 298.06, 298.31, 298.34; 427/99, 534, 535, 569, 570, 574, 575, 578; 438/714, 729, 726, 731, 771, 776, 788, 792; 315/111.21, 111.31, 111.61; 216/37, 67, 71

[56] References Cited

U.S. PATENT DOCUMENTS

| | | | |
|---|---|---|---|
| 4,367,114 | 1/1983 | Steinberg et al. ........................ | 156/345 |
| 4,491,496 | 1/1985 | Laporte et al. ........................ | 156/345 |

(List continued on next page.)

FOREIGN PATENT DOCUMENTS

| | | | |
|---|---|---|---|
| 0 651 426 A1 | 5/1995 | European Pat. Off. ......... | H01J 37/32 |
| 56-100422 | 8/1981 | Japan . | |
| 59-144132 | 8/1984 | Japan . | |
| 3-002377 | 1/1991 | Japan ............................. | C23C 16/50 |
| 5-160032 | 6/1993 | Japan . | |
| 5-175163 | 7/1993 | Japan . | |
| 7-230899 | 8/1995 | Japan ............................. | H05H 1/46 |
| 7-245295 | 9/1995 | Japan .......................... | H01L 21/3065 |
| 8-124862 | 5/1996 | Japan . | |

OTHER PUBLICATIONS

Search report dated Jun. 15, 1998 from European patent application EP 97 30 4311.

Hongching Shan et al., "MxP+: A new dielectric etcher with enabling technology, high productivity, and low cost-of-consumables," J. Vac. Sci. Tech. B 14(2), pp. 716–723, Mar. 1996.

Search report dated Mar. 23, 1998 from European patent application EP 97 30 4311.

IBM Technical Disclosure Bulletin vol. 30, No. 2, pp. 543–544 (1987).

*Primary Examiner*—Jeffrey E. Russel
*Attorney, Agent, or Firm*—Robert J. Stern

[57] ABSTRACT

A method of adjusting the cathode DC bias in a plasma chamber for fabricating semiconductor devices. A dielectric shield is positioned between the plasma and a selected portion of the electrically grounded components of the chamber, such as the electrically grounded chamber wall. The cathode DC bias is adjusted by controlling one or more of the following parameters: (1) the surface area of the chamber wall or other grounded components which is blocked by the dielectric shield; (2) the thickness of the dielectric; (3) the gap between the shield and the chamber wall; and (4) the dielectric constant of the dielectric material. In an apparatus aspect, the invention is a plasma chamber for fabricating semiconductor devices having an exhaust baffle with a number of sinuous passages. Each passage is sufficiently long and sinuous that no portion of the plasma within the chamber can extend beyond the outlet of the passage. By blocking the plasma from reaching the exhaust pump, the exhaust baffle reduces the deposition of unwanted particles on exhaust pump components. The exhaust baffle also reduces the cathode DC bias by reducing the effective surface area of the electrically grounded chamber wall which couples RF power to the plasma.

21 Claims, 4 Drawing Sheets

U.S. PATENT DOCUMENTS

| | | | |
|---|---|---|---|
| 4,512,283 | 4/1985 | Bonifield et al. | 118/723 |
| 4,590,042 | 5/1986 | Drage | 422/186.06 |
| 4,802,968 | 2/1989 | Hendrix et al. | 156/345 |
| 4,817,558 | 4/1989 | Itoh | 118/725 |
| 5,044,311 | 9/1991 | Mase et al. | 118/723 |
| 5,047,115 | 9/1991 | Charlet et al. | 156/643 |
| 5,065,698 | 11/1991 | Koike | 118/719 |
| 5,137,610 | 8/1992 | Shumate et al. | 204/192.32 |
| 5,210,055 | 5/1993 | Nakaguma et al. | 438/710 |
| 5,210,466 | 5/1993 | Collins et al. | 315/111.21 |
| 5,271,963 | 12/1993 | Eichman et al. | 427/248.1 |
| 5,273,588 | 12/1993 | Foster et al. | 118/723 E |
| 5,304,279 | 4/1994 | Coultas et al. | 156/345 |
| 5,332,468 | 7/1994 | Engelhardt | 204/192.25 |
| 5,336,355 | 8/1994 | Zarowin et al. | 156/345 |
| 5,366,585 | 11/1994 | Robertson et al. | 156/643 |
| 5,399,387 | 3/1995 | Law et al. | 427/574 |
| 5,413,673 | 5/1995 | Fujimoto | 156/345 |
| 5,415,728 | 5/1995 | Hasegawa et al. | 156/643.1 |
| 5,441,568 | 8/1995 | Cho et al. | 118/715 |
| 5,534,751 | 7/1996 | Lenz et al. | 315/111.71 |
| 5,558,717 | 9/1996 | Zhao et al. | 118/723 E |
| 5,605,637 | 2/1997 | Shan et al. | 216/71 |
| 5,662,770 | 9/1997 | Donohoe | 438/716 |
| 5,705,019 | 1/1998 | Yamada et al. | 156/345 |

ADJUSTING DC BIAS VOLTAGE IN PLASMA CHAMBERS

CROSS-REFERENCE TO RELATED APPLICATIONS

This patent application is a continuation-in-part of application Ser. No. 08/356,825 filed Dec. 15, 1994 by Shan et al, now U.S. Pat. No. 5,605,637.

FIELD OF THE INVENTION

This invention relates generally to plasma chambers used for fabricating semiconductor devices. More specifically, this invention relates to apparatus and methods of adjusting the DC bias voltage on one or more chamber electrodes to which RF power is applied.

BACKGROUND OF THE INVENTION

In the fabrication of semiconductor devices, plasma chambers commonly are used to perform various fabrication processes such as etching, chemical vapor deposition (CVD), and sputtering. Generally, a vacuum pump maintains a very low pressure within the chamber while a mixture of process gases continuously flows into the chamber and an electrical power source excites the gases into a plasma state. The constituents of the process gas mixture are chosen to effect the desired fabrication process.

In essentially all etching and CVD processes, and in many sputtering processes, the semiconductor wafer or other workpiece is mounted on a cathode electrode, and a radio frequency (RF) electrical power supply is connected, through a DC blocking capacitor, between the cathode electrode and an anode electrode in the chamber. Most commonly, the walls of the chamber are metal and are connected to the RF power supply to function as the anode electrode. When the chamber walls are the anode, they typically are connected to electrical ground.

The body of the plasma has a positive charge such that its average DC voltage is positive relative to the cathode and anode electrodes. Because the RF power supply is connected to the cathode and anode electrodes through a DC blocking capacitor, the respective DC voltages at the cathode and anode can be unequal. Specifically, because the cathode's surface area facing the plasma is much smaller than the anode's surface area facing the plasma, the cathode is much more negative than the anode. In other words, the voltage drop between the plasma body and the cathode is much greater than the voltage drop between the plasma body and anode. This voltage asymmetry is a widely observed phenomenon, although its physical cause is complex and not completely understood. (See M. A. Lieberman et al., "Principles of Plasma Discharges and Materials Processing," pub. John Wiley & Sons, 1994, pages 368–372.) The negative DC voltage at the cathode relative to the anode commonly is referred to as the "cathode DC bias".

The negative DC bias voltage at the cathode accelerates ions from the plasma to bombard the semiconductor wafer with a kinetic energy approximately equal to the voltage drop between the cathode and the plasma body. The kinetic energy of the bombarding ions can be beneficial in promoting the chemical or physical reactions desired for the semiconductor fabrication process.

However, bombarding ions having excessive kinetic energy can damage the device structures being fabricated on the semiconductor wafer. Therefore, it often is desirable to reduce the cathode DC bias.

A known method of reducing the cathode DC bias is to reduce the level of RF power applied to the cathode electrode. However, reducing the RF power undesirably reduces the rate of dissociation of molecules in the plasma, thereby undesirably reducing the rate at which the fabrication process is carried out (i.e., increasing the time required to fabricate a semiconductor device). Therefore, a need exists for an apparatus and method for reducing the cathode DC bias other than by reducing the RF power supplied to the cathode.

Certain semiconductor fabrication processes require more highly energetic ion bombardment than other processes. It is desirable for a single plasma chamber to be adaptable to a number of different processes. Therefore, a need exists for a method of adjusting the cathode DC bias in a given chamber other than by adjusting the RF power supplied to the cathode.

SUMMARY OF THE INVENTION

In one aspect, the present invention is a method of adjusting the DC bias on one chamber electrode relative to another electrode by interposing a dielectric shield between one of the electrodes and the plasma. Adjusting any property of the shield which alters the capacitance between the plasma and the electrode covered by the shield can be used to adjust the DC bias. Specifically, the DC bias is adjusted by any of the following adjustments: (1) changing the thickness of the dielectric in the shield; (2) substituting a dielectric material having a different dielectric constant; (3) changing the size or shape of the dielectric to change the surface area of the electrode which is covered thereby; or (4) changing the gap between the shield and the covered electrode.

In particular, the method is useful to adjust or reduce the DC bias voltage at the cathode electrode in a plasma chamber in which the anode electrode includes an electrically grounded chamber wall. The dielectric shield is positioned between the plasma and a selected portion of the electrically grounded components of the chamber, such as the chamber wall. The method permits reducing the magnitude of the negative DC bias voltage at the cathode (relative to the anode) without reducing the RF power applied to the cathode.

In another aspect, the present invention is a plasma chamber for fabricating semiconductor devices having an exhaust baffle which reduces the cathode DC bias by reducing the effective surface area of the electrically grounded chamber wall which couples RF power to the plasma. Specifically, the exhaust baffle has a number of sinuous passages, and the baffle overlies the exhaust port of the plasma chamber so that chamber gases exhausted from the chamber by the vacuum pump pass through the sinuous passages. Each passage is sufficiently long and sinuous that no portion of the plasma within the chamber can extend beyond the outlet of the passage.

The exhaust baffle of the invention electrically isolates the plasma from the portion of the chamber wall behind the baffle, thereby reducing the effective surface area of the grounded chamber wall which couples RF power to the plasma. This reduces the ratio of the effective chamber wall surface area facing the plasma to the cathode surface area facing the plasma, thereby advantageously reducing the magnitude of the negative DC bias at the cathode.

To further reduce the cathode DC bias, the exhaust baffle can include dielectric material. Preferably, the dielectric isolates any electrically conductive elements in the exhaust baffle from the grounded chamber wall. The dielectric should be substantially thicker than the width of the plasma sheath or, alternatively, of sufficient thickness to substantially impede the coupling of RF power from the chamber wall to the plasma via the exhaust baffle.

BRIEF DESCRIPTION OF THE DRAWINGS

Like-numbered elements in different drawings are the same.

DETAILED DESCRIPTION OF THE PREFERRED EMBODIMENTS

1. Mechanical Description of Preferred Embodiment

Before describing the operation of the invention, the structural details of a vacuum chamber incorporating the invention will be described.

Figure 1:
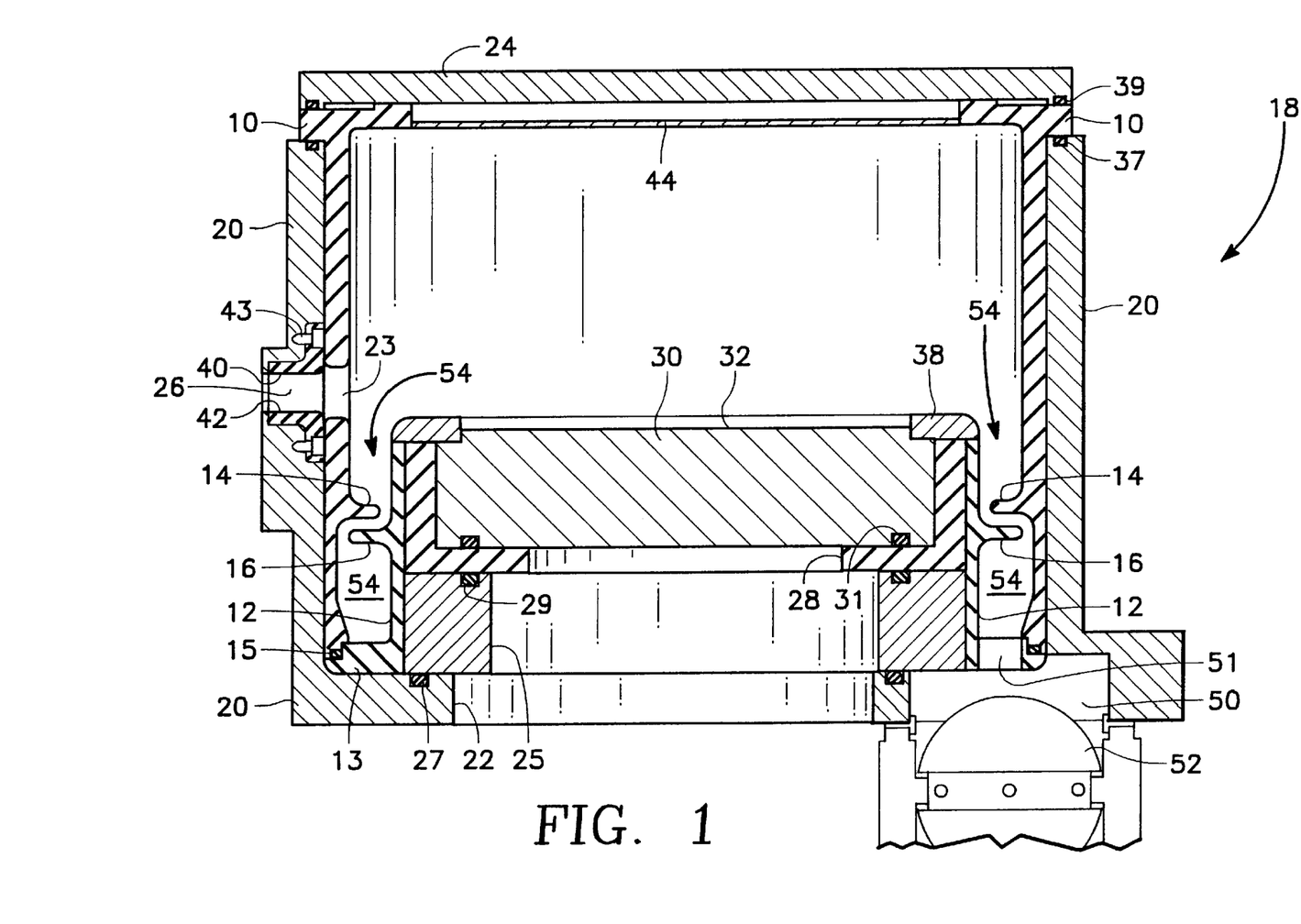
FIG. 1 is a plan view of a plasma etching chamber having an exhaust baffle and a dielectric shield according to the preferred embodiment of the present invention.

FIG. 1 shows the presently preferred embodiment of the invention as implemented in a vacuum chamber used for plasma etching of silicon oxide dielectric layers on a silicon wafer. The principal components of the invention are a dielectric anode shield 10 and an anodized aluminum cathode shield 12. Each of the two shields 10 and 12 is generally cylindrical in shape; more specifically, each is symmetrical about the longitudinal axis of the chamber cathode 30.

The anode shield 10 and the cathode shield 12 respectively include overlapping annular protrusions 14 and 16, respectively, which function in combination as an exhaust baffle.

The sides and bottom of the vacuum chamber are bounded by an aluminum wall 18. The side portion 20 of the chamber wall 18 is essentially cylindrical. The bottom portion 22 of the chamber wall is annular, with a central opening in the center to accommodate a cathode pedestal to be described below. (The side portion 20 and the bottom portion 22 of the chamber wall 18 are referred to below as the chamber side wall 20 and the chamber bottom wall 22, respectively.) The top of the vacuum chamber is bounded by a circular aluminum lid 24. An annular aperture or slit 26 in the chamber side wall 20 allows a workpiece (e.g., a silicon wafer) to be transferred into and out of the chamber. The anode shield 10 also has an aperture 23 coincident with the slit 26. A vacuum valve (not shown), known as a slit valve, maintains a vacuum seal over the wafer transfer slit 26 while a workpiece is being etched during operation of the chamber.

An annular aluminum spacer 25 is attached to the chamber bottom wall 22 by bolts (not shown), and an O-ring 27 provides a vacuum seal between the spacer and the wall. A quartz dielectric spacer 28, having an annular shape with an L-shaped cross-section, rests atop the aluminum spacer. An O-ring 29 provides a vacuum seal between the two spacers.

A disc-shaped aluminum cathode electrode 30 has a flat, circular top surface 32 on which a silicon wafer to be etched is placed by a robot (not shown). The cathode 30 rests atop the lower, inwardly-extending portion of the L-shaped dielectric spacer 28. An O-ring 31 provides a vacuum seal between the cathode and the dielectric spacer. The O-rings 27, 29, 31 permit the region beneath the cathode to remain at atmospheric pressure while the interior of the vacuum chamber is operated at a vacuum.

An RF transmission line (not shown) connects the cathode to the ungrounded output terminal of an RF power supply 60 (shown only in FIG. 3), the other power supply output terminal being connected to the electrically grounded chamber wall 18. The lower, inwardly-extending portion of the L-shaped dielectric spacer 28 insulates the cathode from the metal spacer 25, which is electrically grounded through its attachment to the chamber bottom wall 22. The side portion of the L-shaped dielectric spacer surrounds the cathode and prevents any electrical discharge between the cathode and the adjacent portion of the chamber side wall 20.

A quartz dielectric ring 38 rests atop the cathode and protects the top perimeter of the cathode from exposure to the plasma. The remaining top surface 32 of the cathode is covered by a semiconductor wafer during chamber operation.

The upper periphery of the anode shield 10 includes an outwardly projecting annular lip. The lip rests on the upper edge of the chamber side wall 20 and supports the weight of the anode shield. An O-ring 37 provides a vacuum seal between the upper lip of the anode shield 10 and the upper edge of the chamber side wall 20. Another O-ring 39 provides a vacuum seal between the upper lip of the anode shield 10 and the chamber lid 24.

The lower end of the cathode shield 12 is a horizontal annular flange 13 which rests on the chamber bottom wall 22. The flange 13 covers the entire exposed surface of the lower chamber wall between the metal spacer 25 and the anode shield 10. The cathode shield 12 is held in place by the weight of the anode shield 10. Specifically, the axial length of the anode shield 10 is sufficient to compress an O-ring 15 on the lower flange 13 of the cathode shield 12. The O-ring 15 enables the weight of the anode shield 10 to press the flange 13 of the cathode shield downward against the chamber bottom wall 22, thereby improving heat transfer between the flange 13 and the bottom wall 22, for reasons to be explained below.

In the preferred embodiment, the bottom surface of the flange 13 is bare aluminum, whereas all other surfaces of the cathode shield 12 are anodized. The bare aluminum provides consistently good electrical contact between the cathode shield 12 and the grounded chamber bottom wall 22, thereby providing more consistent performance of the semiconductor fabrication process performed in the chamber than would be possible if an anodized bottom surface provided inconsistent electrical contact. However, as explained below, it may be desirable to fabricate the cathode shield of a dielectric. In that case, there would be no risk of inconsistent electrical contact between the cathode shield and any electrode.

We found our O-ring 15 tends to stick to the two shields 10 and 12, making it difficult to separate the shields when they are being replaced. Therefore, the chamber preferably includes a thin, aluminum ring (not shown) placed between the O-ring 15 and the bottom of the anode shield 10.

Additionally, two smaller dielectric shields 40 and 42 cover the upper and lower surfaces, respectively, of the wafer transfer slit 26 through which the workpiece is carried into and out of the chamber. Each of the slit shields 40 and 42 is attached to the chamber side wall by a number of bolts 44. The anode shield 10 covers these bolts so that they are not exposed to the plasma in the chamber.

A perforated, circular, gas distribution plate 44, commonly called a showerhead, is mounted on the underside of the chamber lid 24 and is coaxial with the cathode 30. The gas distribution plate is composed of a dielectric material such as quartz. The anode shield 10 surrounds the perimeter of the gas distribution plate so as to cover the exposed area of the chamber lid 24. One or more gas lines connect to fittings in the chamber lid and convey process gases to the inlet manifold area above the gas distribution plate. The process gases then flow through the gas distribution plate into the interior of the chamber.

The process gases exit the chamber through a circular exhaust port 50 in the chamber bottom wall 22. A vacuum pump (not shown) coupled to the exhaust port pumps process gases out of the chamber and maintains a desired level of vacuum within the chamber. A throttle valve 52 mounted between the exhaust port 50 and the vacuum pump regulates the gas pressure within the chamber by regulating the impedance to gas flow from the exhaust port 50 to the vacuum pump. The annular flange 13 at the bottom of the cathode shield 12 includes an arcuate aperture 51, coinciding with the circular exhaust port 50, to permit gases to exit the chamber through the flange aperture 51 and through the exhaust port 50.

Figure 3:
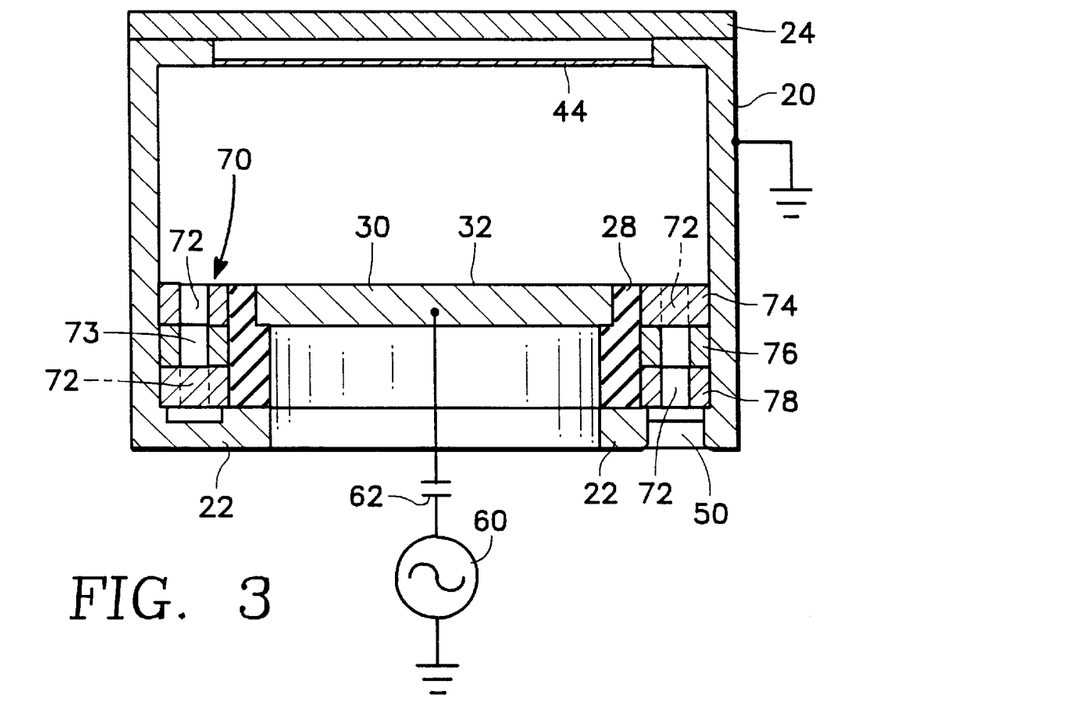
FIG. 3 is a plan view of a plasma etching chamber having an annular dielectric exhaust baffle with a plurality of zig-zag passages.

A radio frequency (RF) power supply 60 (not shown in FIG. 1) produces an RF voltage across two output terminals which are ungrounded and grounded, respectively. The ungrounded output is connected through a DC blocking capacitor 62 to the cathode electrode 30. (The RF power supply and capacitor are shown in FIG. 3, which depicts an alternative embodiment of the exhaust baffle.) The grounded output of the RF power supply connects to all components of the chamber which are electrically grounded, including the chamber wall 18, the chamber lid 24, and the throttle valve 52. Because the RF power supply is connected between the cathode electrode and the grounded chamber components, these grounded components collectively function as the anode electrode.

The RF electrical power applied between the cathode electrode 30 and the grounded chamber wall 18 excites the process gases into a plasma state. A significant proportion of the gas molecules in the plasma are dissociated into their constituent atoms, ions, and free electrons. These particles interact with each other and with the surface material of the semiconductor workpiece to perform a desired semiconductor device fabrication process.

2. Reducing or Adjusting Cathode DC Bias a. Overview of Cathode DC Bias

As stated in the earlier section entitled "Background of the Invention", the body of the plasma has a positive charge such that its average DC voltage is positive relative to the cathode and anode electrodes. Because the RF power supply 60 is connected in series with a DC blocking capacitor 62, the respective DC voltages at the cathode and anode can be unequal. Specifically, because the cathode's surface area facing the plasma is much smaller than the anode's surface area facing the plasma, the cathode is much more negative than the anode. In other words, the voltage drop between the plasma body and the cathode is much greater than the voltage drop between the plasma body and anode. The average negative DC voltage $V_{bias}$ at the cathode electrode relative to the (typically grounded) anode electrode commonly is referred to as the "cathode DC bias".

The negative DC bias voltage at the cathode accelerates ions from the plasma to bombard the semiconductor wafer with a kinetic energy approximately equal to the voltage drop between the cathode and the plasma body. The kinetic energy of the bombarding ions can be beneficial in promoting the chemical or physical reactions desired for the semiconductor fabrication process.

However, bombarding ions having excessive kinetic energy can damage the device structures being fabricated on the semiconductor wafer. Therefore, it often is desirable to reduce the cathode DC bias.

In our invention, the magnitude of the negative DC bias voltage at the cathode (relative to the anode) is reduced by interposing a dielectric shield between the plasma and a portion of the anode electrode surface facing the plasma, thereby reducing the effective surface area of the anode electrode through which power from the RF power supply 60 is capacitively coupled to the plasma. In the illustrated preferred embodiment, the anode shield 10 covers almost all of the exposed surface of the electrically grounded chamber wall 18 which otherwise would capacitively couple RF power to the plasma within the chamber. If the resulting decrease in cathode DC bias is more than desired, decreasing the size of the dielectric shield so as to decrease the portion of the anode surface covered by dielectric will increase the cathode DC bias.

b. Modelling DC Bias in a Conventional Plasma Chamber

Figure 2A:
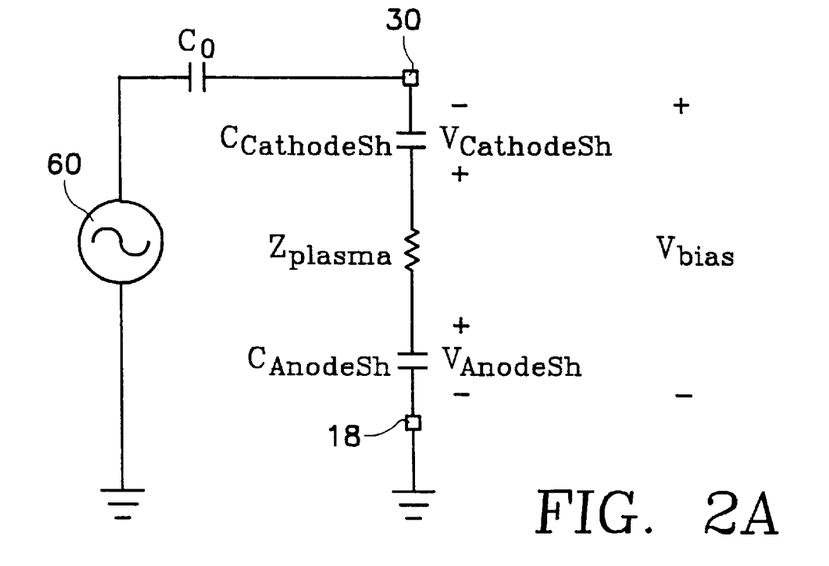
FIGS. 2A and 2B are electrical schematics of a simplified model of how RF power is capacitively coupled to the plasma, respectively excluding and including a dielectric shield according to the invention.
Figure 2B:
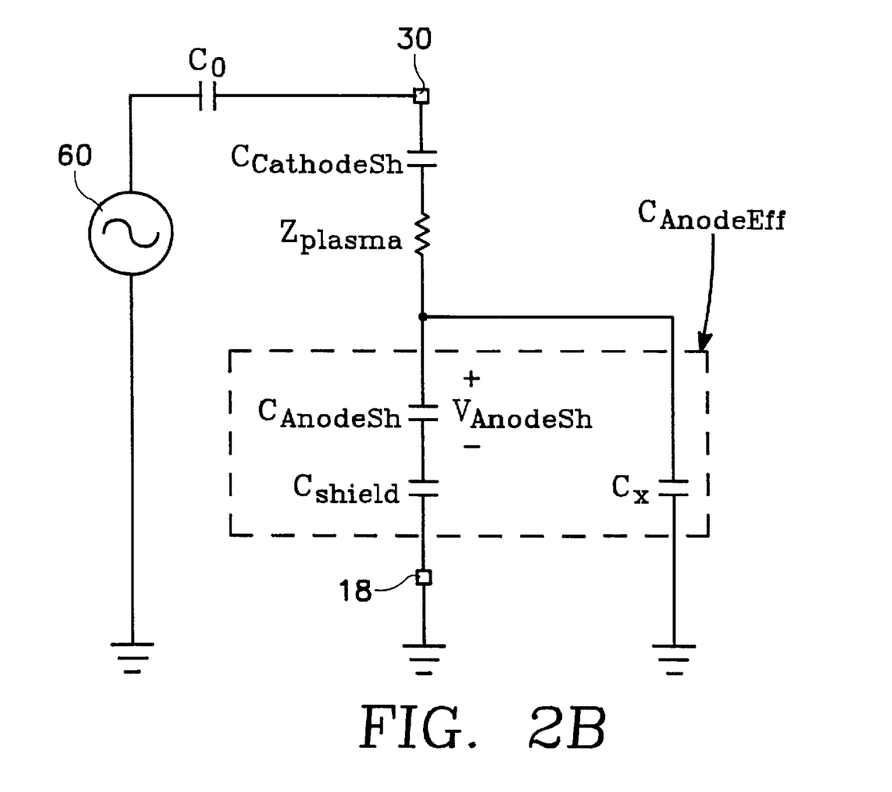

The physics of how the RF power is coupled to the plasma is complex and not completely understood. (See Lieberman, supra, pp. 368–372.) We believe the operation of the invention can be understood by reference to the electrical models shown in FIGS. 2A and 2B. FIG. 2A represents a conventional plasma chamber without the dielectric shield of the present invention, and FIG. 2B represents the same chamber with the addition of our dielectric shield. The modelling of physical elements by resistors and capacitors as shown in FIG. 2 is only a rough approximation, because the actual behavior of these elements is non-linear.

In FIG. 2A, the plasma body is modelled as an impedance $Z_{plasma}$ having resistive and inductive components. The plasma is surrounded by a sheath or dark space which is highly depleted of free electrons and which can be modeled as a vacuum, that is, as a dielectric having a dielectric constant of unity (Lieberman, supra, p. 95, equation 4.2.25a). Capacitor $C_{CathodeSh}$ models the capacitance between the cathode 30 and the plasma body, i.e., the capacitance across the plasma sheath adjacent the cathode. (The subscript "CathodeSh" is an abbreviation for "Cathode Sheath", i.e., "the plasma sheath adjacent the cathode".) Although the chamber geometry is not planar, to a first approximation $C_{CathodeSh}$ is like a parallel plate capacitor in which the cathode electrode 30 and the plasma body are the two plates, and the plasma sheath is the dielectric between the two plates.

The capacitance $C_{CathodeSh}$ between the plasma body and the cathode 30 is proportional to the area $A_{cathode}$ of the portion of the surface of cathode 30 which faces and contacts the plasma sheath. (In general, $A_{cathode}$ equals the area of the cathode top surface 32, plus some upper portion of the cathode side wall, depending on how far the plasma extends down the side of the cathode. However, in the preferred embodiment, the L-shaped dielectric spacer 28 decouples the side of the cathode from the plasma, so $A_{cathode}$ simply equals the area of the cathode top surface 32.) Furthermore, the capacitance $C_{CathodeSh}$ is inversely proportional to the width $W_{CathodeSh}$ of the plasma sheath or dark space adjacent the cathode. Hence, $C_{CathodeSh} \propto A_{cathode}/W_{CathodeSh}$, where the symbol "$\propto$" means "is proportional to".

Similarly, the capacitor $C_{AnodeSh}$ models the capacitance between the anode electrode and the plasma body, i.e., the capacitance across the plasma sheath adjacent the anode. The capacitance of $C_{AnodeSh}$ is proportional to $A_{anode}$ divided by $W_{AnodeSh}$, where $A_{anode}$ is the surface area of the portion of the anode electrode which faces and contacts the plasma sheath, and $W_{AnodeSh}$ is the width of the plasma sheath or dark space adjacent the anode electrode. The surface area $A_{anode}$ includes the inner surface of the chamber side wall 20 and the portion of the chamber lid 24 outside the perimeter of the quartz gas distribution plate 44. Aanode additionally may include the upward-facing surfaces of the chamber bottom wall 22 and the grounded exhaust throttle valve 52, to the extent the plasma sheath extends to contact such surfaces.

Although unimportant to a qualitative understanding of the present invention, an additional consideration complicates a quantitative analysis of the invention. The proportionality between the surface area of an electrode and the capacitance between that electrode and the plasma body is non-linear, because the capacitance and the plasma sheath width adjacent that electrode are interdependent. Specifically, the plasma sheath width $W_{AnodeSh}$ decreases in response to a decrease in the DC sheath voltage drop $V_{AnodeSh}$, and, for reasons explained below, the DC sheath voltage drop $V_{AnodeSh}$ decreases in response to an increase in the capacitance $C_{AnodeSh}$. Therefore, increasing the anode surface area $A_{anode}$ will increase the capacitance $C_{AnodeSh}$, which will decrease the voltage drop $V_{AnodeSh}$ across the plasma sheath adjacent the anode, which will decrease the plasma sheath width $W_{AnodeSh}$ adjacent the anode, which will further increase the capacitance $C_{AnodeSh}$.

Consequently, the capacitance $C_{AnodeSh}$ between the anode and the plasma body is roughly proportional to the anode surface area $A_{anode}$ raised to a power "q", where "q" is a function of the geometry of the cathode and anode electrodes, the gas pressure in the chamber, and other factors. (Lieberman, supra, pp. 368–372). Similarly, the plasma body-to-cathode capacitance $C_{CathodeSh}$ is roughly proportional to the total cathode surface area raised to the power "q".

The RF power supply 60, is connected between the cathode electrode and the anode electrode through a series-connected capacitor $C_0$ which functions to block DC voltage. In general, it does not matter which point in the circuit is connected to electrical ground, or whether the DC blocking capacitor $C_0$ connects to the cathode or the anode. In practice, when the anode electrode includes the chamber wall 18, it is most convenient to connect the anode electrode and one of the two RF power supply output terminals to electrical ground as shown in FIG. 2, and to connect the DC blocking capacitor $C_0$ between the cathode and the ungrounded output terminal of the RF power supply.

Conventionally, the capacitance selected for the DC blocking capacitor is $C_0$ is much greater than both $C_{AnodeSh}$ and $C_{CathodeSh}$, so that the RF voltage drop across the DC blocking capacitor is negligible. The plasma impedance $Z_{plasma}$ is much smaller than the impedances of both $C_{AnodeSh}$ and $C_{CathodeSh}$, so that the RF voltage drop across the plasma body also is negligible (Lieberman, supra, p. 96, paragraph following equation 4.2.25b). Consequently, the RF voltage produced by the RF power supply is divided between the plasma body-to-cathode capacitance $C_{CathodeSh}$ and the plasma body-to-anode capacitance $C_{AnodeSh}$ in inverse proportion to their respective capacitances.

Furthermore, there is a DC voltage drop across the plasma sheath which approximately equals 0.83 times the RF voltage drop across the sheath. (Lieberman, supra, equation 11.2.22, pp. 342–344, and p. 368). Therefore, the ratio of the DC voltage $V_{CathodeSh}$ across the plasma sheath adjacent the cathode to the DC voltage $V_{AnodeSh}$ across the plasma sheath adjacent the anode approximately equals the ratio of the plasma body-to-anode capacitance $C_{AnodeSh}$ to the plasma body-to-cathode capacitance $C_{CathodeSh}$. That is, $(V_{CathodeSh}/V_{AnodeSh}) \approx (C_{AnodeSh}/C_{CathodeSh})$, where $\approx$ means "approximately equals". Therefore, the DC bias voltage $V_{bias}$ on the cathode electrode relative to the grounded anode electrode is:

$$V_{bias} = (V_{AnodeSh} - V_{CathodeSh}) \propto -(C_{AnodeSh} - C_{CathodeSh}) \qquad \text{(Eqn. 1)}$$

The cathode DC bias is negative because the anode's surface area facing the plasma is much greater than the cathode's surface area facing the plasma, hence $C_{AnodeSh} \gg C_{CathodeSh}$.

c. Reducing or Adjusting DC Bias According to Our Invention

In our invention, a dielectric shield is positioned between the plasma and a selected portion of either the cathode electrode or the anode electrode for the purpose of making the DC bias voltage on that electrode more negative, or, equivalently, for the purpose of making the DC bias voltage on the opposite electrode more positive. In a typical plasma chamber having electrically grounded components such as an electrically grounded chamber wall, the dielectric shield preferably is positioned between the plasma and a selected portion of the electrically grounded components for the purpose of making the DC bias on the opposite, ungrounded electrode more positive, i.e., less negative.

In the preferred embodiment shown in FIG. 1, the electrically grounded chamber wall 18 is the anode electrode, and the semiconductor workpiece is mounted on the top surface 32 of a cathode electrode 30 connected to the ungrounded output terminal of an RF power supply 60. In this embodiment, the dielectric shield 10 reduces the negative DC bias voltage at the cathode relative to the grounded anode.

As will be explained below, the DC bias voltage $V_{bias}$ at the cathode relative to the grounded anode can be adjusted by adjusting one or more of the following parameters: (1) the surface area of the chamber wall or other grounded components which is blocked by the dielectric shield; (2) the thickness of the shield; (3) the gap between the shield and the chamber wall; and (4) the dielectric constant of the shield material.

FIG. 2B shows an electrical model of the preferred plasma chamber shown in FIG. 1 which incorporates a dielectric shield 10 covering most of the anode surface. (To simplify the discussion, the smaller dielectric shields 40, 42 over the slit 26 are not discussed here, but their function is the same as the dielectric anode shield 10.) The dielectric shield 10 has the effect of interposing capacitor $C_{shield}$ between the chamber wall 18 and the perimeter of the plasma sheath. This capacitor $C_{shield}$ represents the capacitance across the dielectric shield 10. The capacitance $C_{AnodeSh}$ between the perimeter of the plasma sheath and the plasma body—i.e., the capacitance across the plasma sheath adjacent the anode—remains approximately the same as in FIG. 2A. (More precisely, as mentioned earlier, the capacitance $C_{AnodeSh}$ across the plasma sheath is somewhat greater in FIG. 2B than in FIG. 2A due to a decrease in sheath width $W_{AnodeSh}$ in response to a decrease in sheath voltage drop $V_{AnodeSh}$.)

The capacitor $C_x$ in FIG. 2B represents the capacitance between the plasma body and the whatever portion of the anode electrode is left uncovered (i.e., exposed to the plasma) by the dielectric shield. It is proportional to the surface area of such uncovered portion which faces the plasma. Initially, we will assume the dielectric shield 10 completely covers the anode electrode, so that the capacitor $C_x$ can be ignored.

The capacitance C of a parallel plate capacitor is the dielectric constant $\epsilon$ of the dielectric which separates the two plates, multiplied by the mutually opposing surface area A of the two plates, divided by the width W of the dielectric separating the two plates. $C=\epsilon A/W$. The capacitance $C_{shield}$ across the dielectric shield has the same surface area $A_{anode}$ as the capacitance $C_{AnodeSh}$ across the corresponding portion of the plasma sheath. As stated earlier, the dielectric constant $\epsilon_{sheath}$ of the plasma sheath is essentially unity. Therefore, the ratio of the shield capacitance to the plasma sheath capacitance is:

$$C_{shield}/C_{AnodeSh} = \epsilon_{shield}(W_{AnodeSh}/W_{shield}) \quad \text{(Eqn. 2)}$$

Since these two capacitances are effectively in series between the anode and the plasma body, the resultant or effective capacitance between the anode and the plasma body is:

$$C_{AnodeEff} = (C_{shield} \cdot C_{AnodeSh})/(C_{shield} + C_{AnodeSh}) \quad \text{(Eqn. 3a)}$$

$$\approx C_{shield} \text{ if } C_{AnodeSh} >> C_{shield} \quad \text{(Eqn. 3b)}$$

The dielectric constant $\epsilon_{shield}$ of materials of which the dielectric shield may be fabricated, such as silicon carbide, ceramics or quartz, is in the range of about 2 to 5. The width $W_{AnodeSh}$ of the plasma sheath typically is 2 mm or less, whereas the width $W_{shield}$ of the dielectric shield in the preferred embodiment is about 5 to 20 mm.

Because the ratio between dielectric widths W can greatly exceed the ratio between dielectric constants $\epsilon$, the capacitance $C_{shield}$ across the dielectric shield can be much smaller than the capacitance $C_{AnodeSh}$ across the plasma sheath. For example, suppose the dielectric shield has a width $W_{shield}$ equal to 15 mm and a dielectric constant of 3, and suppose the plasma sheath width $W_{AnodeSh}$ is 0.8 mm (with a dielectric constant of 1). Then the capacitance $C_{shield}$ across the dielectric shield equals 3×(0.8 mm/15 mm)=0.16 times the capacitance $C_{AnodeSh}$ across the plasma sheath. Consequently, the resultant or effective capacitance $C_{AnodeEff}$ between the anode electrode and the plasma body equals 0.16/(1+0.16)=0.14 times the capacitance across the plasma sheath $C_{AnodeSh}$.

$$C_{AnodeEff} = 0.14 C_{AnodeSh} \quad \text{(Eqn. 4)}$$

In other words, the dielectric shields reduce the capacitive coupling between the plasma body and the portion of the anode covered by the shields to only fourteen percent (14%) of what the capacitive coupling would be without the dielectric shields. This is equivalent to reducing the effective surface area of the shielded portion of the anode electrode to only 14% of its actual surface area.

So far we have disregarded the capacitor $C_x$, which represents the capacitance between the plasma body and any portions of the anode electrode, including any grounded chamber components, which are not covered by the dielectric shield 10 and therefore are directly exposed to the plasma. The capacitance $C_x$ is proportional to such exposed surface area of the anode. The total capacitance $C_{AnodeEff}$ between the anode and the plasma body equals the sum of this capacitance $C_x$ and the capacitance previously calculated in Equation 3b from the series connection of $C_{shield}$ and $C_{AnodeSh}$:

$$C_{AnodeEff} \approx C_x + C_{shield} \quad \text{(Eqn. 5)}$$

In the present invention, the earlier Equation 1, expressing the cathode DC bias as a function of the plasma body-to-cathode capacitance and the plasma body-to-anode capacitance, becomes:

$$V_{bias} = (V_{AnodeSh} - V_{CathodeSh}) \propto -(C_{AnodeEff} - C_{CathodeSh}) \quad \text{(Eqn. 6)}$$

Broadly speaking, our invention is a method of adjusting the DC bias on one electrode relative to another electrode by interposing a dielectric shield between one of the electrodes and the plasma. The preceding equations indicate that adjusting any property of the shield which alters the capacitance between the plasma and the electrode covered by the shield can be used to adjust the DC bias. Specifically, such capacitance is decreased by (1) increasing the thickness of the dielectric in the shield; (2) substituting a dielectric material having a higher dielectric constant; (3) changing the size or shape of the dielectric to increase the surface area of the electrode which is covered thereby; or (4) increasing the gap between the shield and the covered electrode. Decreasing the capacitance between one electrode and the plasma will make the DC bias voltage on that electrode less positive (or more negative) relative to any other electrode, or, equivalently, will make the bias voltage on any other electrode less negative (or more positive) relative to the electrode covered by the dielectric shield.

More specifically, with reference to the preferred embodiment in which the grounded anode electrode is covered by dielectric shield 10 in order to reduce the cathode DC bias $V_{bias}$, the cathode bias can be adjusting downward or upward by decreasing or increasing, respectively, the capacitance $C_{AnodeEff}$. In particular, Equation 5 implies that increasing the portion of the chamber wall covered by the dielectric shield 10 will reduce $C_x$ and thereby reduce the magnitude of the negative cathode bias $V_{bias}$. Equation 2 implies that choosing a material for the shield having a lower dielectric constant, or increasing the thickness of the shield, will reduce $C_{shield}$ and thereby reduce the magnitude of the negative cathode bias voltage $V_{bias}$.

Because a vacuum has a dielectric constant (i.e., unity) less than the dielectric constant of any solid dielectric material, another method for reducing the magnitude of the negative cathode bias is to space the dielectric shield 10 a small distance from the chamber wall 18 so as to create a small vacuum gap between them that functions as a dielectric. Increasing the gap will reduce the capacitance $C_{shield}$ and thereby reduce the magnitude of the negative cathode bias $V_{bias}$. This method preferably should include providing a seal between the edge of the dielectric shield and the chamber wall to keep the plasma from entering the gap. Alternatively, the distance between the shield and the wall can be small enough to prevent the formation of a plasma in the gap.

The invention enables the cathode DC bias to be reduced without reducing the RF power applied to the cathode. Therefore, the RF power can be set to any level desired to obtain a desired process reaction rate and throughput, while the cathode DC bias can be set to a desired voltage by adjusting any of the above-mentioned parameters of the dielectric shield.

If the dielectric shield 10 is readily replaceable, the present invention enables a single plasma chamber to be configured to perform different semiconductor fabrication processes requiring different optimum values of cathode DC bias voltage. The plasma chamber can be provided with a number of interchangeable dielectric shields which differ:

(1) in their thicknesses, (2) in their dielectric constants by using different material compositions, or (3) in their axial lengths or other dimensions so as to cover different amounts of the surface area of the chamber wall.

For example, in a plasma etching chamber, low cathode DC bias typically is desirable for etching metal or silicon features on a semiconductor substrate, whereas high cathode DC bias typically is desirable for etching dielectric features. Our invention enables the chamber to be optimized for metal or silicon etch processes by inserting a dielectric shield having a high thickness, low dielectric constant, or large surface area compared to a dielectric shield employed in the same chamber for a dielectric etching process. Alternatively, for dielectric etching, the dielectric shield could be eliminated altogether, or it could be replaced by a shield composed primarily of electrically conductive material such as anodized aluminum.

The preferred implementation of the dielectric shield 10 as shown in FIG. 1 fulfills the need for a readily replaceable shield as stated in the preceding paragraph. The cylindrical shield 10 is installed simply by lowering it into the chamber, and then closing the chamber lid 24 to secure the shield in place. The shield is removed by the reverse process of simply opening the chamber lid, and then lifting out the shield. The shield is not secured by any bolts. Because the slit 23 in the shield must be aligned with the slit 26 in the chamber wall, the shield preferably includes an alignment pin (not shown) which mates with an alignment slot in the upper edge of the chamber wall to ensure consistent angular orientation.

Another option for adjusting the area of the chamber wall covered by the dielectric shield is to fabricate the shield in separate segments, so that selected ones of the segments can be installed in the chamber to cover selected portions of the chamber wall. Installing more shield segments to cover more of the chamber wall will correspondingly reduce the cathode DC bias.

If plasma enters the gap between the dielectric anode shield 10 and the chamber wall 18, the plasma will effectively bypass or short-circuit the shield by electrically contacting the chamber wall which was intended to be shielded. In the preferred embodiment shown in FIG. 1, there is no path by which the plasma could enter the gap between the dielectric shield and the chamber wall. O-ring 15 between the anode shield and the cathode shield is not intended to provide a vacuum seal, but, for reasons explained below, there is no plasma present near this O-ring because the exhaust baffle 14, 16 blocks the plasma from penetrating downstream of the baffle. Although there are no O-rings between the anode shield 10 and the slit shields 40 and 42, any gap between the anode shield and the slit shields is much smaller than the plasma sheath width, and therefore is too small to admit the plasma.

The invention has been described in the context of a plasma chamber having two electrodes for capacitively exciting the plasma. The invention is equally applicable to chambers having three or more electrodes. In such case, covering a portion of one of the electrodes with a dielectric shield 10 will make the DC bias voltage on that electrode less positive (or more negative) relative to the other electrodes, or, equivalently, will made the bias voltage on the other electrodes less negative (or more positive) relative to the electrode covered by the dielectric shield. As described earlier, the change in DC bias can be adjusted by adjusting the dielectric constant, thickness, surface area, or spacing of the dielectric shield.

The invention also is applicable to chambers in which the plasma is excited inductively or remotely, provided an RF power supply also is connected between two electrodes within the chamber to provided some capacitive coupling of RF power to the plasma.

3. Chamber Cleaning

The ease of replacing the dielectric shield 10 affords another advantage unrelated to the issue of cathode DC bias, namely, chamber cleaning. The process gases used for most semiconductor fabrication processes decompose within the plasma into reactive species which react at any exposed surfaces in the chamber to form deposits on such surfaces. Over time, such deposits may accumulate to the extent that they alter the process conditions within the chamber, or they may flake off the chamber surfaces in the form of microscopic particles which can lodge upon and contaminate the semiconductor workpiece. Accordingly, in most semiconductor processes it is necessary to periodically clean deposits off of all surfaces in the chamber which are exposed to the process gases.

Because our removable anode shield 10 covers essentially all exposed surfaces of the chamber wall 18, deposits which otherwise would accumulate on the chamber wall will accumulate on the shield instead. When the accumulation of deposits on the shield is excessive, the shield readily can be removed and replaced more quickly than a conventional chamber wall could be cleaned, thereby improving the productivity of the plasma chamber.

The reason for including the anodized aluminum cathode shield 12 in the preferred plasma chamber is to facilitate cleaning as described above with respect to the anode shield 10. Specifically, deposits which otherwise would accumulate on the dielectric spacer 28 or the metal spacer 25 will instead accumulate on the cathode shield. When the deposits accumulate to an undesirable level, the cathode shield can be replaced in less time than otherwise would be required to clean such deposits off of the cathode side wall. After removing the anode shield 10 as described above, the quartz ring 38 and the cathode shield 12 can be likewise removed by simply lifting them up through the top of the chamber.

We have found that keeping the anode and cathode shields cool is important to achieving a low level of particulate contamination in the chamber. We believe that cycling of the shield between high and low temperatures tends to cause deposits on the shields to flake off, so that they can contaminate the semiconductor workpiece. To keep the shields cool, our preferred embodiment includes channels (not shown) surrounding the chamber side wall 20 through which cool water is pumped so as to maintain the chamber wall at a temperature of about 65° C. The outward-projecting lip of the anode shield 10 makes good thermal contact with the chamber lid 24 and the chamber side wall 20, thereby conducting heat from the anode shield to the chamber wall. The bottom of the flange 13 makes good thermal contact with the chamber bottom wall 22, thereby conducting heat from the cathode shield to the chamber wall.

The cathode shield 12 preferably is composed of anodized aluminum because aluminum is an excellent thermal conductor, thereby keeping the cathode shield cool. Because the anode shield is dielectric, keeping it cool is more difficult. Suitable dielectric materials for the dielectric shield 10 include silicon carbide, aluminum oxide (alumina), aluminum nitride, quartz (silicon dioxide), and various resins. One advantage of silicon carbide is that it is a much better heat conductor than most dielectrics, so it will remain cooler. Aluminum nitride also is a good heat conductor, but it has two disadvantages: it is difficult to obtain with impurity concentrations low enough to avoid contaminating the semiconductor fabrication process, and aluminum compounds are undesirable in etch processes which use fluorine, because fluorine is highly reactive with aluminum.

Alternatively, the dielectric shield 10 can be fabricated of a dielectric which is a poor heat conductor, such as quartz, if the dielectric is sandwiched together with another material which is a good heat conductor, such as aluminum. For example, the dielectric shield can be a sheet of quartz affixed to a sheet of aluminum.

4. Sinuous Exhaust Baffle

The plasma chamber shown in FIG. 1 includes an additional inventive feature, namely, an exhaust baffle 14, 16 which reduces the magnitude of the negative DC bias voltage at the cathode (relative to electrical ground) by reducing the capacitive coupling between the plasma and electrically grounded exhaust components.

In general, the exhaust baffle according to our invention has a number of sinuous passages, and the baffle overlies the exhaust port of the plasma chamber so that chamber gases exhausted from the chamber by the vacuum pump pass through the sinuous passages. Each passage is sufficiently long and sinuous that the plasma within the chamber cannot extend beyond the outlet of the passage. Consequently, the plasma is electrically isolated from electrically grounded components downstream of the exhaust baffle, such as the vacuum pump (not shown) and the throttle valve 52.

In addition to reducing the cathode DC bias, our exhaust baffle has the advantage of reducing or eliminating the deposition of polymers and other undesirable reaction compounds on the throttle valve 52, vacuum pump, and other components downstream of the baffle. The gases exhausted from a semiconductor process chamber typically include reactive chemical species (reactive molecules, atoms, and ions) which tend to react and form deposits on surfaces which they contact. A common problem is that film deposits accumulate on the throttle valve 52 and the vacuum pump, which eventually requires shutting down the plasma chamber for cleaning or replacement of these components.

In our invention, the sinuous passages of the exhaust baffle markedly increase the rate of collisions between gas atoms and the walls of the passages. Such collisions promote the reactions which deposit the undesirable films, so that more film is deposited in the exhaust baffle passages. This depletes the concentration of reactive species in the exhaust gases passing through the exhaust baffle, so as to reduce or eliminate the deposition of unwanted films on the throttle valve 52, vacuum pump, and other downstream components.

FIG. 1 shows our preferred implementation of the exhaust baffle 14, 16. As described earlier, the process gases exit the chamber through a circular exhaust port 50 in the chamber bottom wall 22. A vacuum pump (not shown) coupled to the exhaust port pumps process gases out of the chamber and maintains a desired level of vacuum within the chamber. A throttle valve 52 mounted between the exhaust port 50 and the vacuum pump regulates the gas pressure within the chamber by regulating the impedance to gas flow from the exhaust port 50 to the vacuum pump.

All gases exhausted from the chamber must pass through the annular gap or cavity 54 which functions as an exhaust manifold. This gap 54 is bounded on the inside by annular cathode shield 12 which covers the radially outer surface of the dielectric spacer 28 surrounding the cathode 30 and the radially outer surface of the metal spacer 25, and it is bounded on the outside by annular anode shield 10 which covers the radially inner surface of the chamber side wall 20. Although the gap 54 is annular and completely encircles the cathode 30, the aperture through which the exhaust gases exit the chamber does not completely encircle the cathode.

Instead, the bottom of the exhaust manifold is bounded by the bottom flange 13 of the cathode shield 12. The exhaust gases exit the chamber through the arcuate aperture 51 in the portion of the flange 13 which overlies the exhaust port 50 in the chamber bottom wall 22.

The sinuous exhaust passage of our invention is defined by annular protrusions 14 and 16 which protrude into the exhaust manifold cavity 54 from the anode shield 10 and the cathode shield 12, respectively. Because the protrusions overlap each other in the radial dimension, the chamber gases cannot travel a straight path through the exhaust manifold cavity 54. Instead, the upper protrusion 14 forces the downward-flowing exhaust gases to turn radially inwardly toward the cathode shield 12, and then the lower protrusion 16 forces the exhaust gases to reverse direction and flow radially outwardly toward the anode shield 10. This sinuous path directs a high proportion of the molecules, atoms, and ions in the exhaust gas to collide with the boundary walls of the exhaust manifold, i.e., the surfaces of the anode shield 10 and the cathode shield 12. The high rate of collision with the boundary walls promotes the rate of reactions by which reactive species in the exhaust gas form stable molecules, generally including molecules which deposit as films on the boundary walls.

The high reaction rate of reactive species within the sinuous exhaust passage enables two beneficial results.

The first beneficial result is that reactive species which otherwise would form undesirable deposits on the throttle valve 52 or the vacuum pump will instead form such deposits on the boundary walls of the sinuous exhaust passage, i.e., on the surfaces of the anode shield 10 and the cathode shield 12 adjacent the protrusions 14 and 16. Consequently, reactive species will be significantly depleted from the exhaust gas downstream of the exhaust baffle 14, 16. If the shields 10 and 12 are readily removable for cleaning or replacement as in the preferred embodiment described above, it is highly desirable to promote such deposits on the shields in preference to the throttle valve and vacuum pump, which are more difficult to clean and maintain. Almost complete depletion of reactive species downstream of the exhaust baffle is possible if the exhaust passage is sufficiently long and sinuous.

The second beneficial result is a reduction in the cathode DC bias. Specifically, if the exhaust passage through the baffle 14, 16 is sufficiently long and sinuous, the concentration of ions in the exhaust gas downstream of the exhaust baffle will be below the level necessary to sustain a plasma. The exhaust baffle 14, 16 then can be said to block or quench the plasma. Consequently, the electrically grounded components downstream of the exhaust baffle (such as the chamber bottom wall 22 and throttle valve 52) will be electrically isolated or decoupled from the plasma, thereby reducing the magnitude of the negative DC bias at the cathode 30.

The two stated benefits of the sinuous exhaust baffle 14, 16 are achieved whether the exhaust baffle is metal or dielectric. In addition, because the plasma is likely to contact to at least the upper part of the exhaust baffle 14, 16, the cathode DC bias can be further reduced by minimizing the capacitive coupling between electrical ground and the surfaces of the exhaust baffle facing the plasma. This can be implemented by incorporating in the exhaust baffle a dielectric material positioned between the plasma and any electrically grounded chamber components adjacent the baffle.

For example, in the preferred embodiment shown in FIG. 1, the upper portion 14 of the exhaust baffle is adjacent the electrically grounded chamber side wall 20. Therefore, the cathode DC bias is reduced either by fabricating the entire anode shield 10 of dielectric (as in FIG. 1), or else by including in the shield 10 a dielectric member interposed between the chamber side wall 20 and the surface of the protrusion 14 which is exposed to the plasma.

To substantially reduce the capacitive coupling between the plasma and electrically grounded chamber components adjacent to the exhaust baffle, the dielectric preferably should be substantially thicker than the width of the plasma sheath or, alternatively, of sufficient thickness to substantially impede the coupling of RF power from the plasma to any adjacent grounded components via the exhaust baffle.

In contrast, the lower portion 16 of the exhaust baffle is not adjacent an electrically grounded component; it is adjacent the dielectric spacer 28. (Even in a hypothetical embodiment which omits the dielectric spacer 28 between the cathode shield 12 and the cathode 30, the cathode is electrically isolated from ground, so the lower portion 16 of the exhaust baffle would not be adjacent a grounded component in the hypothetical embodiment either.) Therefore, no further reduction in cathode DC bias would be achieved by incorporating dielectric material in the lower protrusion 16. Consequently, the lower protrusion 16, as well as the entire cathode shield 12, preferably is fabricated of anodized aluminum because of its superior thermal conductivity, for reasons described in the preceding section entitled "Chamber Cleaning".

Although the portion of the cathode shield 12 below the exhaust baffle 14, 16 does abut an electrically grounded component—namely, the metal spacer 25—the plasma is quenched by the exhaust baffle so that no plasma reaches this lower portion of the cathode shield. Therefore, no reduction in cathode DC bias would be achieved by incorporating dielectric material in the portion of the cathode shield below the exhaust baffle 14, 16.

The exhaust baffle initially was described as having a "number" of sinuous exhaust passages. However, the preferred embodiment just described has only one exhaust passage, an annular passage which encircles the cathode. FIG. 3 shows a plasma chamber including an alternative embodiment of an exhaust baffle 70 having a plurality of sinuous passages 72, 73. The exhaust baffle 70 is a annular assembly which occupies the gap between the chamber side wall 20 and an annular dielectric ring 28 which surrounds the cathode 30. As in the FIG. 1 embodiment, the chamber bottom wall 22 has a circular exhaust port or aperture 50 through which gases are exhausted from the chamber by a vacuum pump (not shown).

Figure 4:
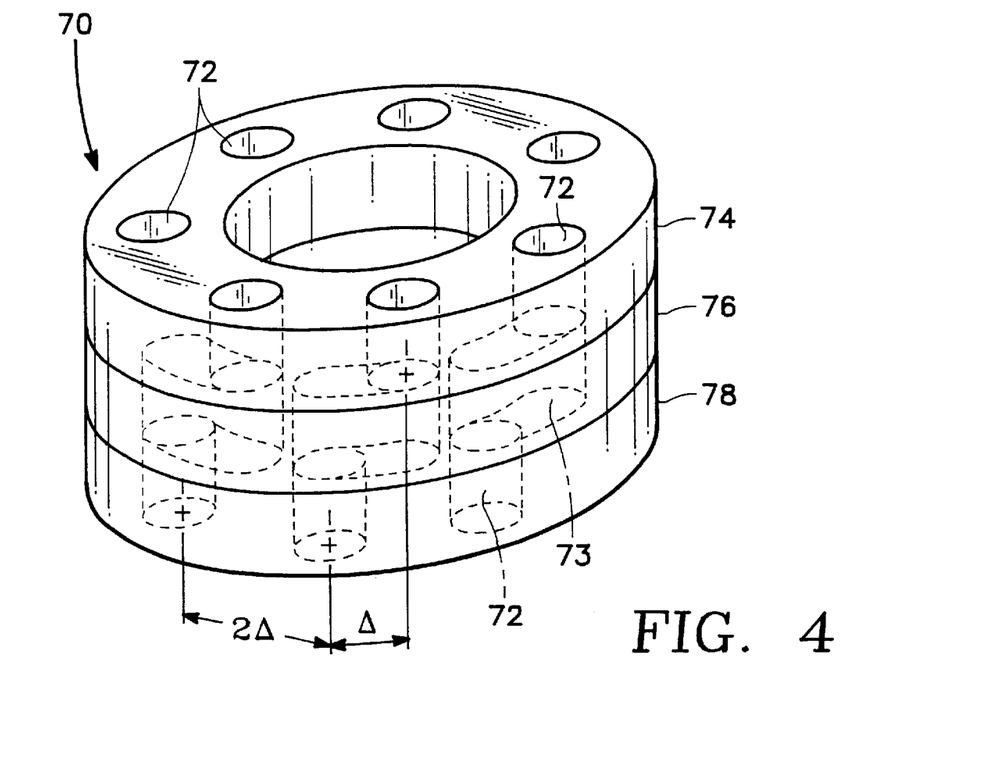
FIG. 4 is a perspective view of the annular dielectric exhaust baffle in FIG. 3.
Figure 5:
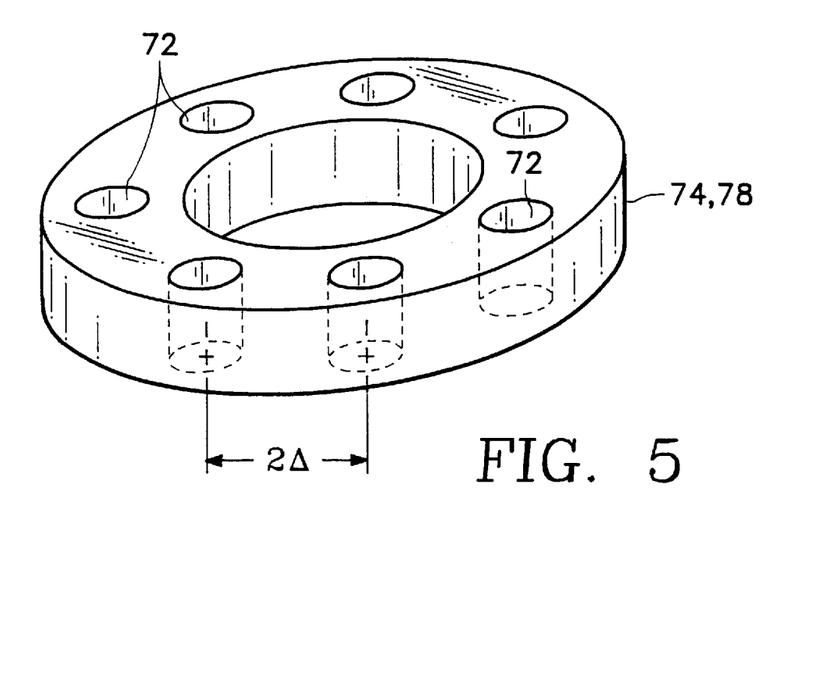
FIG. 5 is a perspective view of the upper and lower rings in the annular exhaust baffle of FIG. 4.
Figure 6:
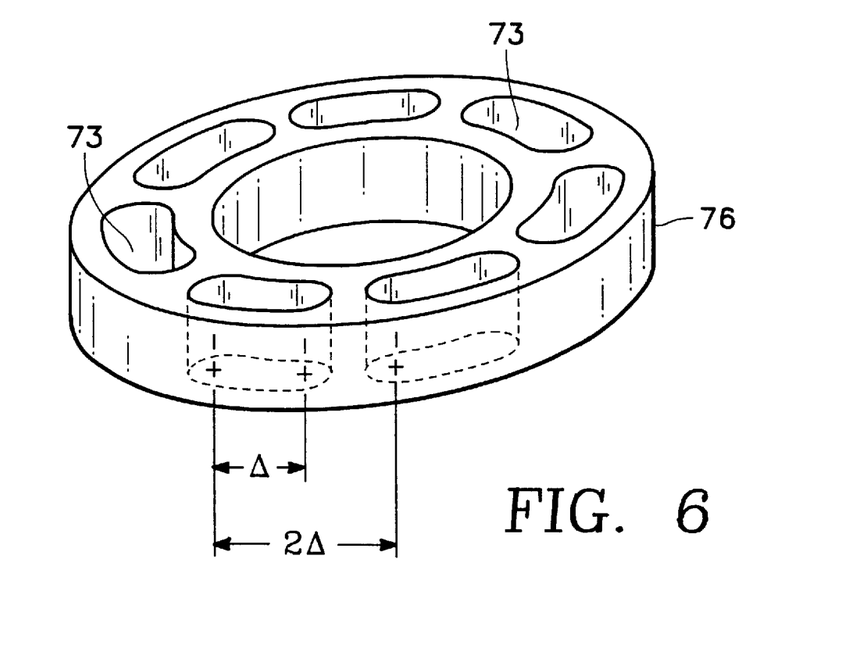
FIG. 6 is a perspective view of the middle ring in the annular exhaust baffle of FIG. 4.

As shown in FIGS. 3 and 4, the exhaust baffle 70 is constructed of three rings 74, 76, and 78 stacked upon each other coaxially. The top ring 74 and the bottom ring 78 are identical, as shown in FIG. 5. The top ring and the bottom ring each have a plurality of axially oriented cylindrical holes 72 spaced around the circumference of the ring. The angular spacing between adjacent holes is defined as 2Δ. If the integer N represents the number of holes 72, then 2Δ=360°/N. The diameter of each of the holes 72 is less than Δ/2. The middle ring 76, as shown in FIG. 6, has a similar array of N circumferentially spaced holes 73 extending axially between its top and bottom surfaces, except that the N holes 73 have an elongated cross section, with a circumferential angular width of Δ.

When the three rings 74, 76, and 78 are stacked as shown in FIG. 4, the holes 72 and 73 define zig-zag exhaust passages. Specifically, the counterclockwise end of each elongated hole 73 in the middle ring 76 is aligned with a hole 72 in the upper ring 74, and the clockwise end of each elongated hole 73 in the middle ring 76 is aligned with a hole 72 in the lower ring 78. Consequently, exhaust gases travel downward (i.e., axially) through a hole 72 in the top ring 74, then turn 90° to travel horizontally (i.e., circumferentially) through a hole 73 in the middle ring 76, then turn 90° again to travel downward through a hole 72 in the bottom ring 78.

The exhaust baffle 70 having zig-zag or sinuous exhaust passages 72, 73 affords benefits similar to those of the sinuous exhaust passage in the FIG. 1 embodiment. Specifically, it promotes reactive species in the exhaust gas to react and form deposits in the exhaust baffle 70 rather than downstream, thereby minimizing the need to clean deposits from the throttle valve and vacuum pump. Additionally, it quenches the plasma so as to prevent capacitive coupling between the plasma and the chamber bottom wall 22, thereby reducing cathode DC bias.

The exhaust baffle 70 can be composed of a dielectric material to further reduce capacitive coupling between the plasma and the portion of the chamber side wall 20 adjacent the exhaust baffle. For example, plastic resins are good dielectrics and are particularly easy materials in which to drill holes 72, 73. A disadvantage of some plastic resins is that they may visually resemble the deposits which accumulate on the exhaust baffle during operation of the plasma chamber, thereby making it difficult to visually recognize when the baffle is dirty and requires replacement.

We found the stacked ring embodiment of FIGS. 3–6 particularly useful for quickly constructing a prototype to test the effectiveness of different zig-zap exhaust passage designs. For example, if the illustrated 3-ring design is found insufficient to quench the plasma for a particular chamber and process conditions, additional rings can be stacked to produce an exhaust passage with additional 90° turns. The two ring designs shown in FIGS. 5 and 6, respectively, should occupy alternate positions in the stack. Additionally, the rings can be rotated relative to each other to test the effect of varying the length of the horizontal passage 73 in the middle ring.

We claim:

1. A plasma chamber for fabricating semiconductor devices, comprising:
   (a) a plasma chamber;
   (b) a gas inlet for receiving a gas into the chamber;
   (c) plasma excitation means for exciting the gas to a plasma state;
   (d) an exhaust port through which gas can be exhausted from the chamber;
   (e) a vacuum pump, connected to the exhaust port, for exhausting gas from the chamber; and
   (f) an exhaust baffle having a number of sinuous passages, wherein
      (i) the baffle overlies the exhaust port so that gas exhausted from the chamber passes though the sinuous passages, and
      (ii) each passage is sufficiently long and sinuous that any plasma inside the chamber does not extend completely through the passage.

2. A chamber according to claim 1, wherein the exhaust baffle comprises dielectric material.

3. A chamber according to claim 1, wherein the exhaust baffle comprises:
   (a) a first baffle member including
      (i) a cylindrical wall, and
      (ii) an annular protrusion which extends radially outward from the cylindrical wall; and
   (b) a second baffle member, positioned coaxially with and encircling the first baffle member, including

17

(i) a cylindrical wall, and
(ii) an annular protrusion which extends radially inward from the cylindrical wall;
(c) wherein the respective protrusions of the first and second baffle members are spaced apart in an axial direction and are at least partially overlapping in a radial direction.

4. A chamber according to claim 3, wherein:
the chamber further comprises an electrically conductive chamber wall and a first electrode mounted inside the chamber and electrically insulated from the electrically conductive chamber wall;
the first baffle member encircles the first electrode; and
the second baffle member is mounted adjacent the electrically conductive chamber wall.

5. A chamber according to claim 3, wherein:
the second baffle member is mounted close enough to the electrically conductive chamber wall to prevent the formation of said plasma between the second baffle member and the electrically conductive chamber wall.

6. For use with a semiconductor processing plasma chamber, a method of reducing deposition of particles on exhaust pump components, comprising the steps of:
providing a plasma chamber;
forming a plasma within the chamber;
exhausting gases from the chamber through an exhaust port; and
positioning over the exhaust port an exhaust baffle having a number of sinuous passages so that gas exhausted from the chamber passes through the passages of the exhaust baffle, wherein each passage is sufficiently long and sinuous that the plasma within the chamber does not extend completely through the passage.

7. For use with a semiconductor processing plasma chamber, a method of changing the DC bias voltage at a first electrode in a positive direction, comprising the steps of:
providing a plasma chamber having a number of chamber components;
connecting at least one component of the chamber to an electrical ground;
providing within the chamber a first electrode which is electrically insulated from the electrical ground;
forming a plasma within the chamber;
applying RF electrical power between the first electrode and the electrical ground so as to create a DC bias voltage at the first electrode relative to the electrical ground;
exhausting gases from the chamber through an exhaust port; and
positioning over the exhaust port an exhaust baffle having a number of sinuous passages so that gas exhausted from the chamber passes through the passages of the exhaust baffle, wherein each passage is sufficiently long and sinuous that the plasma within the chamber does not extend completely through the passage.

8. A method according to claim 7, wherein the at least one component which is connected to the electrical ground in the connecting step includes an electrically conductive wall of the chamber.

9. A method according to claim 7, wherein the positioning step further comprises insulating the exhaust baffle from the electrical ground.

10. A method according to claim 7, wherein the positioning step further comprises including within the exhaust baffle a dielectric material positioned between the plasma and the electrical ground.

11. Apparatus for plasma processing of semiconductor devices, comprising:

18 a vacuum chamber having first and second electrodes, the two electrodes being electrically insulated from each other;
means for forming a plasma inside the chamber;
an RF power supply connected between the first electrode and the second electrode so as to create a DC bias voltage at the first electrode relative to the second electrode;
a dielectric shield mounted between the plasma and a selected area of the second electrode so as to block direct contact between the plasma and said selected area of the second electrode, wherein the shield is mounted at a non-zero distance from the second electrode; and
a seal between the second electrode and the perimeter of the dielectric shield for preventing plasma from entering between the shield and the second electrode.

12. Apparatus for plasma processing of semiconductor devices, comprising:
a vacuum chamber having first and second electrodes, the two electrodes being electrically insulated from each other;
means for forming a plasma inside the chamber;
an RF power supply connected between the first electrode and the second electrode so as to create a DC bias voltage at the first electrode relative to the second electrode; and
a dielectric shield mounted between the plasma and a selected area of the second electrode so as to block direct contact between the plasma and said selected area of the second electrode, wherein the shield is mounted at a non-zero distance from the second electrode;
wherein the second electrode includes an electrically conductive wall of the chamber.

13. Apparatus according to claim 12, wherein:
the electrically conductive wall is connected to an electrical ground; and
the RF power supply is connected between the first electrode and the electrical ground.

14. For use in a semiconductor processing plasma chamber, a method of changing the DC bias voltage at a first electrode in a positive direction, comprising the steps of:
providing a plasma chamber having first and second electrodes, the two electrodes being electrically insulated from each other;
forming a plasma inside the chamber;
applying RF electrical power between the first electrode and the second electrode so as to create a DC bias voltage at the first electrode relative to the second electrode;
positioning a dielectric shield between the plasma and a selected area of the second electrode so as to block direct contact between the plasma and said selected area of the second electrode and so as to position the shield at a non-zero distance from the second electrode; and
sealing between the second electrode and the perimeter of the shield to prevent plasma from entering between the shield and the second electrode.

15. For use in a semiconductor processing plasma chamber, a method of changing the DC bias voltage at a first electrode in a positive direction, comprising the steps of:
providing a plasma chamber having first and second electrodes, the two electrodes being electrically insulated from each other;
forming a plasma inside the chamber;

applying RF electrical power between the first electrode and the second electrode so as to create a DC bias voltage at the first electrode relative to the second electrode;

positioning a dielectric shield between the plasma and a selected area of the second electrode so as to block direct contact between the plasma and said selected area of the second electrode, wherein the shield includes a dielectric material having a substantially higher thermal conductivity than quartz.

16. A method of controllably changing the DC bias voltage at a first electrode in a semiconductor processing plasma chamber, comprising the steps of:

providing a plasma chamber having first and second electrodes, the two electrodes being electrically insulated from each other;

forming a plasma inside the chamber;

applying RF electrical power between the first electrode and the second electrode so as to create a DC bias voltage at the first electrode relative to the second electrode; and positioning a first dielectric shield between the plasma and a first selected portion of the second electrode so as to block direct contact between the plasma and said selected portion of the second electrode and so as to position the shield away from the second electrode so as to create a gap between the shield and the second electrode; and sealing between the second electrode and the perimeter of the shield so as to prevent the formation of plasma in the gap;

wherein the positioning step further includes adjusting said DC bias voltage by adjusting at least one of the parameters within the group consisting of
(i) the thickness of the shield, and
(ii) the spacing between the shield and the second electrode.

17. A method of controllably changing the DC bias voltage at a first electrode in a semiconductor processing plasma chamber, comprising the steps of:

providing a plasma chamber having first and second electrodes, the two electrodes being electrically insulated from each other;

forming a plasma inside the chamber;

applying RF electrical power between the first electrode and the second electrode so as to create a DC bias voltage at the first electrode relative to the second electrode;

positioning a first dielectric shield between the plasma and a first selected portion of the second electrode so as to block direct contact between the plasma and said selected portion of the second electrode; and adjusting the bias voltage by replacing the first dielectric shield with a second dielectric shield having a different dielectric constant.

18. A method of controllably changing the DC bias voltage at a first electrode in a semiconductor processing plasma chamber, comprising the steps of:

providing a plasma chamber having first and second electrodes, the two electrodes being electrically insulated from each other;

forming a plasma inside the chamber;

applying RF electrical power between the first electrode and the second electrode so as to create a DC bias voltage at the first electrode relative to the second electrode;

positioning a first dielectric shield between the plasma and a first selected portion of the second electrode so as to block direct contact between the plasma and said selected portion of the second electrode;

performing in the chamber a process for etching a non-dielectric material while the first dielectric shield is positioned in the chamber; and performing in the chamber a process for etching a dielectric material while the first dielectric shield is absent from the chamber.

19. A method of controllably changing the DC bias voltage at a first electrode in a semiconductor processing plasma chamber, comprising the steps of:

providing a plasma chamber having first and second electrodes, the two electrodes being electrically insulated from each other;

forming a plasma inside the chamber;

applying RF electrical power between the first electrode and the second electrode so as to create a DC bias voltage at the first electrode relative to the second electrode;

positioning a first dielectric shield between the plasma and a first selected portion of the second electrode so as to block direct contact between the plasma and said selected portion of the second electrode;

performing in the chamber a plasma process for etching a non-dielectric material while the first dielectric shield is positioned in the chamber; and performing in the chamber a plasma process for etching a dielectric material while a second dielectric shield is positioned in the chamber, wherein the second shield has physical characteristics different from those of the first shield so as to produce a more negative DC bias voltage on the first electrode.

20. A method of controllably changing the DC bias voltage at a first electrode in a semiconductor processing plasma chamber, comprising the steps of:

providing a plasma chamber having first and second electrodes, the two electrodes being electrically insulated from each other;

forming a plasma inside the chamber;

applying RF electrical power between the first electrode and the second electrode so as to create a DC bias voltage at the first electrode relative to the second electrode;

positioning a first dielectric shield between the plasma and a first selected portion of the second electrode so as to block direct contact between the plasma and said selected portion of the second electrode;

performing in the chamber a first plasma process while both the first dielectric shield and a second dielectric shield are positioned in the chamber, the second shield being positioned between the plasma and a second selected portion of said second electrode; and performing in the chamber a second plasma process while the first dielectric shield is positioned in the chamber and the second dielectric shield is absent from the chamber.

21. A method according to claim 20, wherein:

the first plasma process is a process for etching a non-dielectric material; and the second plasma process is a process for etching a dielectric material.

* * * * *